US008338306B2

(12) United States Patent
Heinrich et al.

(10) Patent No.: US 8,338,306 B2
(45) Date of Patent: Dec. 25, 2012

(54) FORMING SEMICONDUCTOR RESISTORS IN A SEMICONDUCTOR DEVICE COMPRISING METAL GATES BY INCREASING ETCH RESISTIVITY OF THE RESISTORS

(75) Inventors: Jens Heinrich, Wachau (DE); Ralf Richter, Dresden (DE); Katja Steffen, Dresden (DE); Johannes Groschopf, Radebeul (DE); Frank Seliger, Dresden (DE); Andreas Ott, Dresden (DE); Manfred Heinz, Dresden (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 261 days.

(21) Appl. No.: 12/886,765

(22) Filed: Sep. 21, 2010

(65) Prior Publication Data

US 2011/0073956 A1 Mar. 31, 2011

(30) Foreign Application Priority Data

Sep. 30, 2009 (DE) .......................... 10 2009 043 328

(51) Int. Cl.
*H01L 21/302* (2006.01)
*H01L 21/461* (2006.01)

(52) U.S. Cl. ................. 438/705; 438/200; 257/E21.246
(58) Field of Classification Search ................. 438/705, 438/200, 201, 238; 257/E27.016, E21.219, 257/E21.246
See application file for complete search history.

(56) References Cited

U.S. PATENT DOCUMENTS

| 6,262,456 | B1 * | 7/2001 | Yu et al. ........................ 257/371 |
| 6,406,956 | B1 | 6/2002 | Tsai et al. ..................... 438/201 |
| 2005/0090067 | A1 | 4/2005 | Jawarani ....................... 438/305 |

OTHER PUBLICATIONS

Translation of Official Communication from German Patent Office for German Patent Application No. 10 2009 043 328.7 dated Jul. 28, 2011.

* cited by examiner

*Primary Examiner* — Jarrett Stark
(74) *Attorney, Agent, or Firm* — Williams, Morgan & Amerson, P.C.

(57) ABSTRACT

In a replacement gate approach, the polysilicon material may be efficiently removed during a wet chemical etch process, while the semiconductor material in the resistive structures may be substantially preserved. For this purpose, a species such as xenon may be incorporated into the semiconductor material of the resistive structure, thereby imparting a significantly increased etch resistivity to the semiconductor material. The xenon may be incorporated at any appropriate manufacturing stage.

16 Claims, 6 Drawing Sheets

FORMING SEMICONDUCTOR RESISTORS IN A SEMICONDUCTOR DEVICE COMPRISING METAL GATES BY INCREASING ETCH RESISTIVITY OF THE RESISTORS

BACKGROUND OF THE INVENTION

1. Field of the Invention

The present disclosure generally relates to the field of fabricating integrated circuits, and, more particularly, to resistors in complex integrated circuits that comprise metal gate electrode structures.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit element in highly complex integrated circuits and substantially determine the overall performance of these devices, other components, such as capacitors and resistors, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay. For example, in sophisticated applications, resistors may frequently be provided in the form of "integrated polysilicon" resistors which may be formed above isolation structures so as to obtain the desired resistance value without significantly contributing to parasitic capacitance, as may be the case in "buried" resistive structures which may be formed within the active semiconductor layer. A typical polysilicon resistor may thus require the deposition of the basic polysilicon material which may frequently be combined with the deposition of a polysilicon gate electrode material for the transistor elements. During the patterning of the gate electrode structures, the resistors may also be formed, the size of which may significantly depend on the basic specific resistance value of the polysilicon material and the subsequent type of dopant material and concentration that may be incorporated into the resistors so as to adjust the resistance values. Since, typically, the resistance value of doped polysilicon material may be a non-linear function of the dopant concentration, typically, specific implantation processes are required, independent of any other implantation sequences for adjusting the characteristics of the polysilicon material of the gate electrodes of the transistors, which may thus result in a moderately high complex manufacturing sequence.

Moreover, the continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called "PN junctions," that are formed by an interface of highly doped regions, referred to as "drain" and "source" regions, with a slightly doped or non-doped region, referred to as a "channel" region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as "channel length."

Presently, most complex integrated circuits are based on silicon due to the substantially unlimited availability, the well-understood characteristics of silicon and related materials and processes, and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has been preferably used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called "short channel" behavior, according to which a variability in channel length may have a significant influence on the resulting threshold voltage of the transistor. Aggressively scaled transistor devices with a relatively low supply voltage and, thus, a reduced threshold voltage, therefore, suffer from a significant increase of the leakage current caused by the reduced thickness of a silicon dioxide gate dielectric. For example, a channel length of approximately 0.08 μm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, whereas transistor elements with a longer channel may be used for less critical signal paths (for instance, such critical transistors may be used as storage transistors), the relatively high leakage current caused by the direct tunneling of charge carriers through the ultra-thin silicon dioxide gate dielectric of the high speed transistor elements may reach values for an oxide thickness in the range of 1-2 nm and may no longer be compatible with thermal design power requirements for any type of complex integrated circuit system.

For this reason, replacing silicon dioxide as the material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be in direct contact with gate dielectric material, the presence of a depletion zone may, thus, be avoided, while at the same time a moderately high conductivity may be achieved.

As is well known, the threshold voltage of the transistor may depend on the overall transistor configuration, on the complex lateral and vertical dopant profile of the drain and source regions, and thus the corresponding configuration of the PN junctions, and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, the high-k dielectric material may be formed in combination with an appropriate metal-containing cap layer, such as titanium nitride and the like, followed by the deposition of a polysilicon material in combination with other materials, if required, which may then be patterned in order to form a gate electrode structure. Concurrently, corresponding resistors may be patterned, as described above. Thereafter, the basic transistor configuration may be completed by forming drain and source regions, performing anneal processes, and finally embedding the transistors in a dielectric material. Thereafter, an appropriate etch sequence may be performed in which the top surfaces of the gate electrode structures, and all resistive structures, may be exposed and the polysilicon material may be removed. Subsequently, based on a respective masking regime, appropriate metal-containing electrode materials may be filled into gate electrode structures of N-channel transistors and P-channel transistors, respectively, in order to obtain a superior gate structure, including a high-k gate insulating material in combination with a metal-containing electrode material, which may provide an appropriate work function for N-channel transistors and P-channel transistors, respectively. Concurrently, the resistive structure may also receive the metal-containing electrode material. Due to the enhanced conductivity of the metal-containing electrode material, however, the resistivity of the resistive structures may also exhibit a significantly reduced value, thereby requiring a reduction of line widths of these structures and/or an increase of the total length of these structures. While the former measure may result in patterning problems, since extremely small line widths may be required, the latter aspect may result in an increased consumption of variable chip area. For this reason, in some conventional approaches, the resistive structures may be formed in the active semiconductor material, instead of providing the resistive structures above the isolation structures and patterning the same concurrently with the gate electrode structures of the transistors, which, however, may result in reduced performance due to an increased parasitic capacitance of these resistive structures. In other approaches, the resistors have to rebuilt in a very advanced manufacturing stage, which may significantly reduce the overall throughput.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally relates to semiconductor devices and manufacturing techniques in which resistor elements may be formed on the basis of appropriate semiconductor material, such as a silicon material, a silicon/germanium material and the like, while sophisticated metal gate structures may be provided for the transistor elements. For this purpose, the gate electrode structures may be provided on the basis of a desired semiconductor material appropriate for the resistors and the semiconductor material may be replaced by one or more metal-containing electrode materials in a very advanced manufacturing stage, while the semiconductor material may be substantially preserved in the resistor elements. To this end, the etch resistivity of the semiconductor material may be increased, at least at a surface area thereof, prior to performing a wet chemical etch process for removing the semiconductor material selectively in the gate electrode structures. The increase of the etch resistivity may be accomplished by incorporating an "electrically inert" species, which is to be understood as an atomic species that may not substantially alter the electronic characteristics of the base semiconductor material, while at the same time inducing a significant reduction of a removal rate during the selective wet chemical etch process. In some illustrative aspects disclosed herein, the electrically inert species may comprise xenon, which may be incorporated on the basis of an ion implantation process.

Consequently, a so-called "replacement gate" approach may be efficiently applied in order to obtain sophisticated high-k metal gate stacks, while at the same time semiconductor-based resistive structures may be formed, for instance on isolation structures, thereby providing a superior capacitive behavior of the resistive structure without unduly consuming valuable chip area, which may frequently be required in conventional approaches so as to take into consideration the superior conductivity of metal-containing gate electrode materials compared to semiconductor materials.

One illustrative semiconductor device disclosed herein comprises a transistor element comprising a gate electrode structure, which in turn comprises a high-k gate dielectric material and a metal-containing electrode material that is formed above the high-k gate dielectric material. The semiconductor device further comprises a resistor containing a semiconductor material having an upper portion and a lower portion, wherein the upper portion comprises an electrically inert species so as to impart an increased etch resistivity to the upper portion compared to the lower portion.

One illustrative method disclosed herein relates to forming a resistive structure of a semiconductor device. The method comprises forming a layer stack above a transistor region and a resistor region of the semiconductor device, wherein the layer stack comprises a high-k dielectric material and a semiconductor material. The method further comprises forming a replacement gate electrode structure in the transistor region and forming the resistive structure in the resistor region on the basis of the layer stack. The method further comprises increasing an etch resistivity of the semiconductor material selectively in the resistive structure. Additionally, the method comprises performing a wet chemical etch process so as to remove the semiconductor material selectively in the replacement gate electrode structure while substantially maintaining the semiconductor material having the increased etch resistivity in the resistive structure.

A further illustrative method disclosed herein comprises forming a replacement gate electrode structure above an active semiconductor region and forming a resistive structure above an isolation structure, wherein the replacement gate electrode structure and the resistive structure comprise a semiconductor material. The method further comprises incorporating an implantation species into the semiconductor material selectively in the resistive structure so as to impart an increased etch resistivity to the semiconductor material. Additionally, the method comprises removing the semiconductor material selectively from the replacement gate electrode structure while substantially maintaining the semiconductor material having increased etch resistivity in the resistive structure. Furthermore, the method comprises forming a metal-containing electrode material in the replacement gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
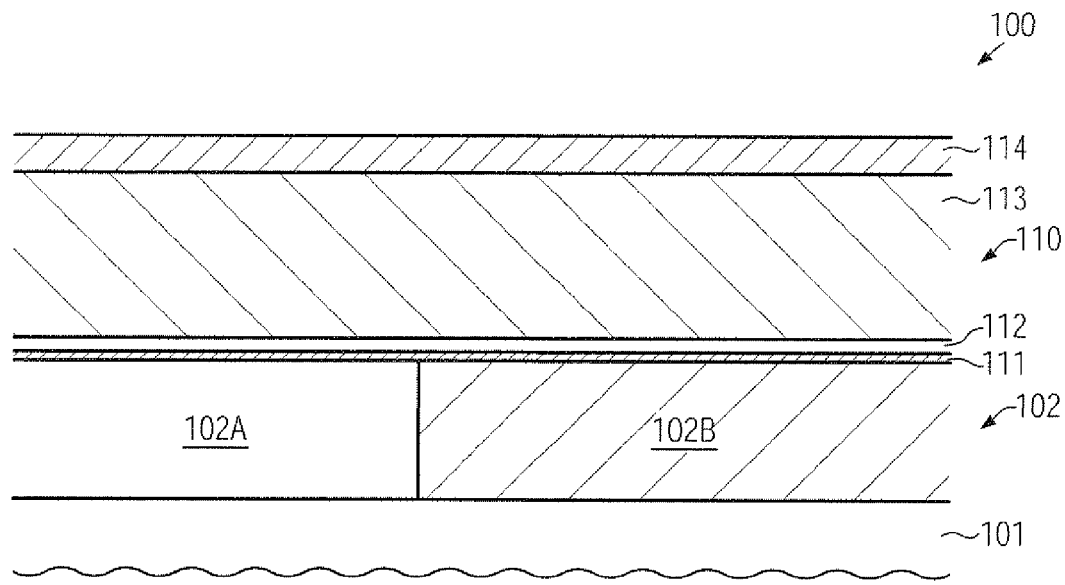
FIGS. 1a-1g schematically illustrate cross-sectional views of a semiconductor device during various manufacturing stages in forming a metal gate electrode structure and a semiconductor-based resistor by increasing the etch resistivity of the semiconductor material selectively in the resistive structure in a late manufacturing stage, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, semiconductor devices and manufacturing techniques are provided in which resistor elements may be formed on the basis of a semiconductor material, such as polysilicon, silicon/germanium and the like, in combination with complex metal-containing gate electrode structures of transistors, wherein the resistive structures may be formed, if required, on isolation structures in order to obtain superior performance with respect to the parasitic capacitance. The semiconductor material may be substantially preserved in the resistive structure by selectively increasing the etch resistivity of the semiconductor material, which may thus exhibit a significantly reduced removal rate during a wet chemical etch process that may be applied to efficiently remove the semiconductor material from the replacement gate electrode structures. For example, a plurality of selective wet chemical etch chemistries are available which, however, exhibit a significant dependency on any atomic species incorporated in the semiconductor material so that a removal rate may be efficiently controlled on the basis of an appropriate species. In some illustrative embodiments disclosed herein, TMAH (tetra methyl ammonium hydroxide) may be used as an efficient wet chemical etch chemistry, which actually represents a chemical that may efficiently etch resist materials, which, however, may also be used in higher concentrations at elevated temperatures in order to etch silicon material with a high degree of selectivity with respect to silicon dioxide, silicon nitride and the like. Additionally, the presence of other atomic species, such as dopants and electrically inert atomic species, may have a significant influence on the actual etch rate. For example, species such as xenon may be efficiently incorporated into an upper part of the semiconductor material with a concentration that may readily be established on the basis of process compliable implantation recipes. In this manner, a significantly increased etch resistivity may be imparted to a silicon-based semiconductor material on the basis of implantation techniques, wherein corresponding process parameters may be readily selected so as to adapt dose and penetration depth of the implantation species to device configuration under consideration. That is, the implantation species may be incorporated at any appropriate stage of the overall process flow, wherein the implantation energy may be efficiently adapted to the presence of possible further materials, which may be provided above the semiconductor material whose effective etch resistivity is to be increased. Furthermore, any influence of the implantation process may be efficiently avoided by providing an implantation mask, such as a resist mask, so that a high degree of flexibility may be achieved with respect to obtaining the desired selectivity of a semiconductor material in the replacement gate electrode structures and the resistive structures. Consequently, semiconductor-based resistors may be provided, for instance on isolation structures, thereby obtaining a low capacitance semiconductor-based resistor configuration, while avoiding additional complex process steps for rebuilding semiconductor-based resistors after filling in the metal material in the gate electrode structures, as may frequently be required in conventional approaches. Furthermore, undue consumption of valuable chip area may be avoided since the basic conductivity of the resistive structure is substantially determined by the semiconductor material, wherein, if required, any conductive materials of the replacement gate electrode structure may be removed selectively in the resistive structure at an early manufacturing stage.

FIG 1a schematically illustrates a cross-sectional view of a semiconductor device 100 comprising a substrate 101 and a semiconductor layer 102 which, in combination, may represent a silicon-on-insulator (SOI) configuration, a bulk configuration or a combination thereof. For example, in an SOI configuration, a buried insulating layer (not shown) may be formed below and adjacent to the semiconductor layer 102, while, in a bulk configuration, the semiconductor layer 102 may be formed on a substantially crystalline material of the substrate 101. It should be appreciated that the "semiconductor" layer 102 may actually be comprised of a plurality of semiconductor regions, which may be laterally separated by isolation structures comprised of any appropriate insulating material. For instance, the semiconductor layer 102 may represent a silicon-based material, which may also comprise other components, such as germanium, carbon and the like, in order to obtain the desired electronic characteristics. Hence, a plurality of active regions 102A may be comprised of the basic semiconductor material of the layer 102, wherein isolation structures 102B may provide the lateral isolation of the active regions. In the embodiment shown, at least a portion of the isolation structure 102B may be considered as a resistor region since a resistive structure is to be formed above the isolation structure 102B in a later manufacturing stage. On the other hand, the active region 102A may be referred to as a transistor region, since, in and above the active region 102A, a transistor is to be formed on the basis of a metal gate electrode structure. It should be appreciated that, in FIG. 1a, the regions 102A, 102B are illustrated as being positioned laterally adjacent to each other, while in other cases the resistor region 102B may be positioned at any appropriate location across the substrate 101, depending on the circuit layout of the semiconductor device 100. Furthermore, in the manufacturing stage shown, a material layer stack 110 may be formed above the active region 102A and the isolation structure 102B and may comprise a gate dielectric material 111, possibly in combination with a conductive cap material 112, such as titanium nitride and the like. As previously explained, the gate dielectric material 111 may comprise a high-k dielectric material (having a dielectric constant greater than 10.0), possibly in combination with a "conventional" gate dielectric material, such as a silicon oxide-based material and the like. Furthermore, the thickness of the layer 111 and the material composition may be appropriately selected so as to obtain the desired electrical performance of a metal gate electrode structure to be formed above the active region 102A. Frequently, the sensitive materials in the layer 111 may be protected by a conductive cap material, which may thus also contribute to the overall conductivity of a resistive structure. As will be described later on in more detail, a corresponding conductive cap material such as the layer 112 may be removed selectively above the resistor region 102B. In other approaches, the materials 111, 112 may represent any dielectric material, at least a portion of which may be removed in a later stage so as to provide a high-k dielectric material after performing any high temperature processes.

In the embodiment shown, the material layer stack 110 may further comprise a semiconductor material 113, such as an amorphous or polycrystalline silicon material, a silicon/germanium mixture and the like. It should be appreciated that the semiconductor material 113 may be provided with any desired dopant concentration as may be appropriate for forming the resistive structure in a later manufacturing stage, since the electronic characteristics of corresponding gate electrode structures may be adapted on the basis of materials to be provided in a later manufacturing stage. For example, an N-type dopant species may be incorporated during deposition of the material 113 and/or in a subsequent implantation process, depending on the overall process strategy. Similarly, a thickness of the layer 113 may be selected in accordance with process requirements, for instance, so as to obtain a desired gate height of a replacement gate electrode structure, while also enabling an efficient patterning of the layer stack 110 based on given design rules for a gate length and for a width of corresponding resistive structures to be formed above the isolation structure 102B. Moreover, further materials, such as a cap layer 114 and the like, may be provided in the layer stack 110, depending on the further processing of the device. It should be appreciated that other materials, such as hard mask materials and the like, may also be applied in order to appropriately pattern the stack 110 during the subsequent processes. For convenience, any such sacrificial materials are not shown in FIG. 1a.

The semiconductor device 100 as illustrated in FIG. 1a may be formed on the basis of any appropriate process strategy. That is, the isolation structure 102B may be formed in the semiconductor layer 102 on the basis of any appropriate patterning strategy for forming trenches and subsequently filling the trenches with any desired insulating material, such as silicon dioxide, silicon nitride and the like. Thus, by forming isolation structures in the layer 102, the lateral position and size of active regions, such as the region 102A, may be defined. Prior to or after forming the isolation structure 102B, the basic dopant concentration may be generated in the active region 102A based on ion implantation and the like. Next, the layer stack 110 may be formed by using appropriate deposition techniques, possibly in combination with oxidation processes in combination with additional treatments, depending on the material composition of the stack 110. For example, a basic silicon oxide material may be formed by deposition or oxidation, followed by the deposition of a high-k dielectric material, thereby providing the layer 111. As discussed above, if required, a conductive cap layer, such as the layer 112, may be formed, followed by the deposition of the semiconductor material 113, which may be accomplished by low pressure chemical vapor deposition (CVD) techniques and the like. Thereafter, any further materials, such as the cap layer 114, for instance in the form of a silicon nitride material, and any other materials may be deposited.

Figure 1B:
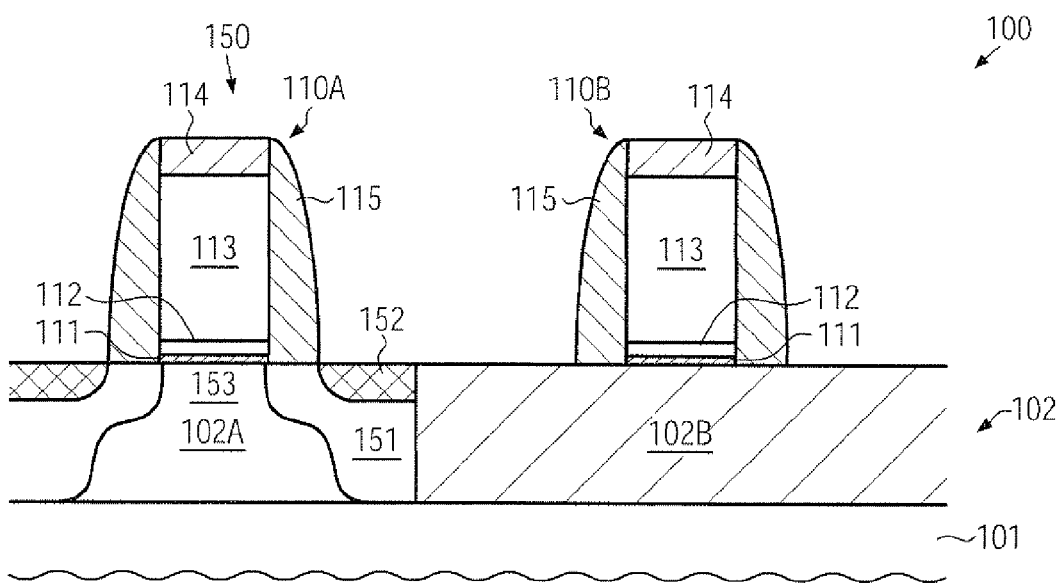

FIG. 1b schematically illustrates the semiconductor device 100 in a further advanced manufacturing stage. As shown, the device 100 may comprise a transistor 150 formed in and above the active region 102A. The transistor 150 may comprise a replacement gate electrode structure 110A including the materials 111, 112, 113 and 114. Furthermore, a sidewall spacer structure 115 may laterally delineate the gate electrode structure 110A. A length of the gate electrode structure 110A may be substantially determined by a horizontal extension of the semiconductor material 113 and may be in the range of approximately 50 nm and less in sophisticated semiconductor devices, as discussed above. Moreover, the transistor 150 may comprise drain and source regions 151 with a channel region 153 positioned between the drain and source regions 151. Moreover, metal silicide regions 152 may be formed in a part of the drain and source regions 151. Similarly, a resistive structure 110B may be formed above the isolation region 102B and may comprise the materials 111, 112, 113 and 114 in combination with the sidewall spacer structure 115. It should be appreciated that the "width" of the resistive structure 110B, i.e., in FIG. 1b, the horizontal extension, may differ from the length of the gate electrode structure 110A, depending on the required overall resistance value of the resistor 110B. As discussed above, the resistance of the structure 110B may depend on the conductivity of the material 113, possibly in combination with the material 112 when representing a conductive material, and the geometry of the structure 110B, i.e., the width and length of the resistor 110B. It should be appreciated that, for the resistive structure 110B, the term 'length' may represent a direction perpendicular to the drawing plane of FIG. 1b.

The semiconductor device 100 as illustrated in FIG. 1b may be formed on the basis of the following processes. The layer stack 110 (FIG. 1a) may be patterned on the basis of any appropriate lithography and etch techniques, thereby obtaining the materials 111, 112, 113 and 114 of the structures 110A, 110B with the desired lateral dimensions. Next, a portion of the sidewall spacer structure 115 may be provided, for instance, in the form of a silicon nitride spacer element, and a first portion of the drain and source regions 151 may be formed by ion implantation. Thereafter, the spacer structure 115 may be provided with one or more further spacer elements (not shown) and the drain and source regions 151 may receive the required complex lateral and vertical dopant profile. It should be appreciated that additional process steps may be implemented, for instance, for incorporating a strain-inducing semiconductor material and the like, if required for enhancing performance of the transistor 150. Thereafter, high temperature processes may be performed in order to activate dopants and re-crystallize implantation-induced damage. Next, the metal silicide regions 152 may be formed by depositing a refractory metal and initiating a chemical reaction, wherein, if desired, the layer 114 may protect the semiconductor material 113, while in other cases a metal silicide may be formed in the semiconductor material 113, if considered appropriate for the further processing of the device 100. After removing any excess material, the basic configuration of the transistor 150 is obtained and the further processing may be continued by depositing a portion of an interlayer dielectric material.

Figure 1C:
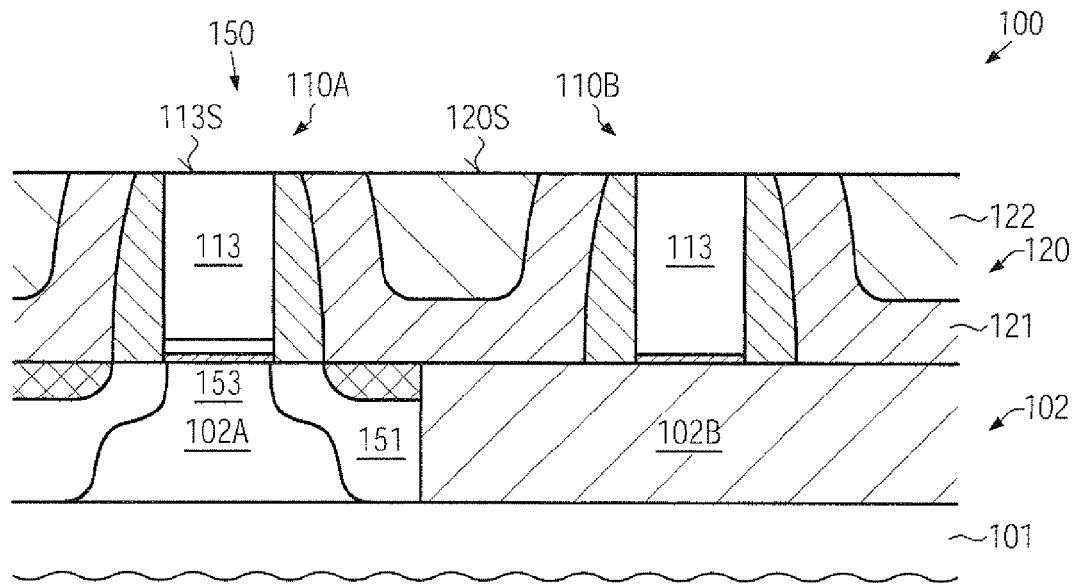

FIG. 1c schematically illustrates the semiconductor device 100 in a further advanced manufacturing stage. As illustrated, the device 100 may comprise an interlayer dielectric material 120 laterally surrounding the gate electrode structure 110A and the resistive structure 110B. For example, the interlayer dielectric material 120 may comprise a first dielectric material 121, such as a silicon nitride material and the like, which may also have a high internal stress level if considered appropriate for the device 100. Moreover, a second dielectric material 122, such as a silicon dioxide material and the like, may be provided. It should be appreciated, however, that the interlayer dielectric material 120 may have any other appropriate composition as required for obtaining the desired electrical performance of the transistor 150 and/or the resistive structure 110B. Furthermore, in the manufacturing stage shown, the dielectric material 120 may comprise a planarized surface 120S at a height level that is appropriate to also expose a surface 113S of the semiconductor material 113 in the gate electrode structure 110A and the resistive structure 110B.

The semiconductor device 100 as illustrated in FIG. 1c may be formed by depositing the interlayer dielectric material 120 using any appropriate deposition technique, followed by a planarization process, for instance, a polishing process, such as chemical mechanical polishing (CMP) and the like. Consequently, upon planarizing the material 120, the surface areas 113S may be exposed.

Figure 1D:
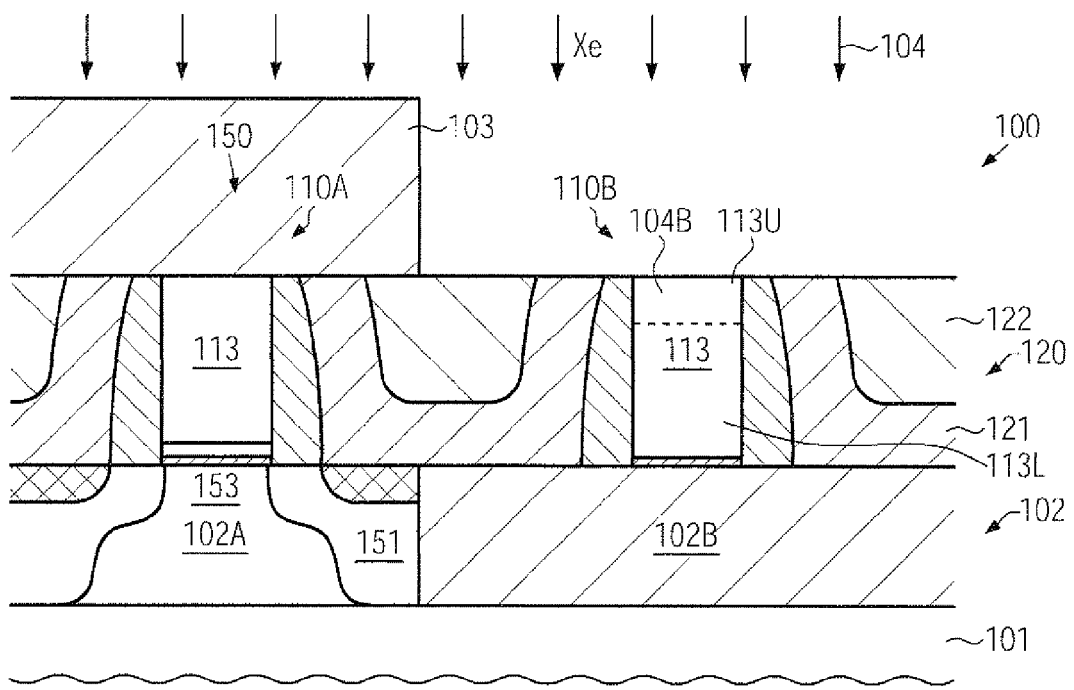

FIG. 1d schematically illustrates the semiconductor device 100 during a process 104 in order to increase an etch selectivity of the material 113 selectively in the resistive structure 110B. In the embodiment shown, the process 104 may represent an ion implantation process for incorporating an appropriate atomic species, such as an electrically inert species, into an upper portion 113U of the semiconductor material 113, thereby imparting an increased etch resistivity to the upper portion 113U compared to a lower portion 113L. In one illustrative embodiment, a species 104B comprising xenon may be incorporated during the implantation process 104, which may thus substantially maintain the basic electronic characteristics of the material 113, while at the same time significantly reducing an etch rate during a subsequent etch process. For this purpose, an appropriate implantation mask 103, such as a resist mask, may be formed so as to selectively cover the transistor 150, which may be accomplished on the basis of well-established lithography techniques. It should be appreciated that appropriate process parameters for the implantation process 104 may be readily established on the basis of simulations, experiments and the like, wherein a desired degree of modification of an etch rate may be determined by performing corresponding experiments using materials 113 having incorporated therein different concentrations of the species 104B. For instance, a concentration of approximately $10^{19}$-$10^{20}$ per $cm^3$ may "convert" a silicon-based material into an efficient "etch stop" material with respect to a wet chemical etch recipe, for instance based on TMAH.

Figure 1E:
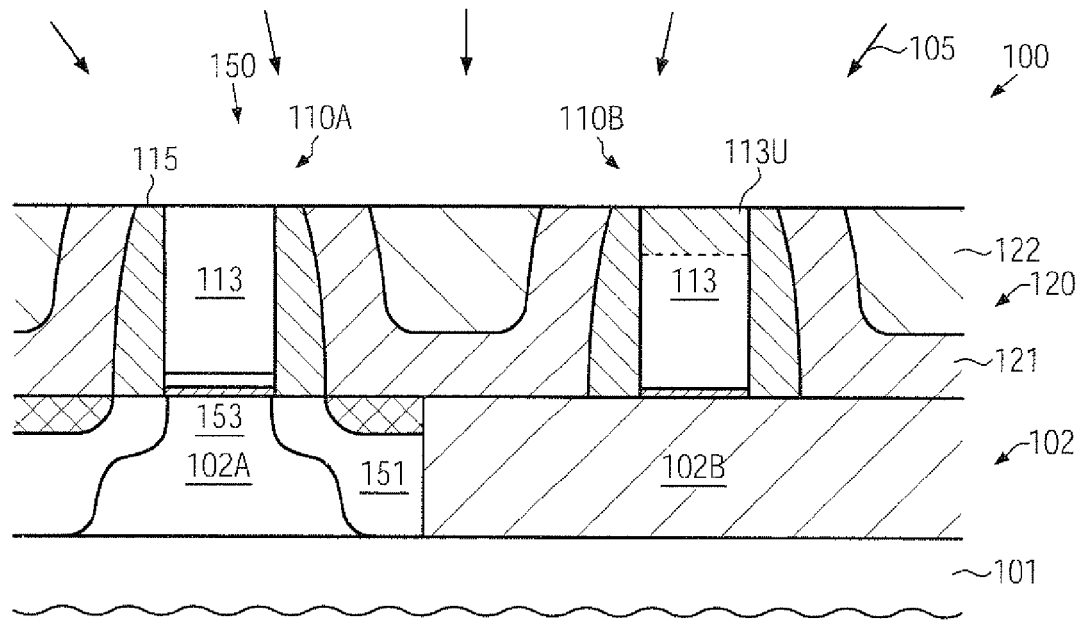

FIG. 1e schematically illustrates the semiconductor device 100 when exposed to a wet chemical etch ambient 105, for instance established on the basis of TMAH, in order to efficiently remove the material 113 from the gate electrode structure 110A, while the material 113 is substantially preserved in the resistive structure 110B due to the presence of the upper portion 113U having the increased etch resistivity. As previously explained, TMAH may also exhibit a high degree of selectivity with respect to dielectric materials, such as silicon dioxide, silicon nitride and the like, so that the interlayer dielectric material 120 and the spacer structure 115 may act as efficient etch stop materials. Furthermore, the material 113 may also be substantially preserved in the resistive structure 110B, which may be understood such that less than approximately ten percent of the initial material 113 of the resistive structure 110B may be removed during the etch process 105. In other cases, less than approximately five percent of the initial material 113 may be removed during the process 105 due to the presence of the upper portion 113U.

Figure 1F:
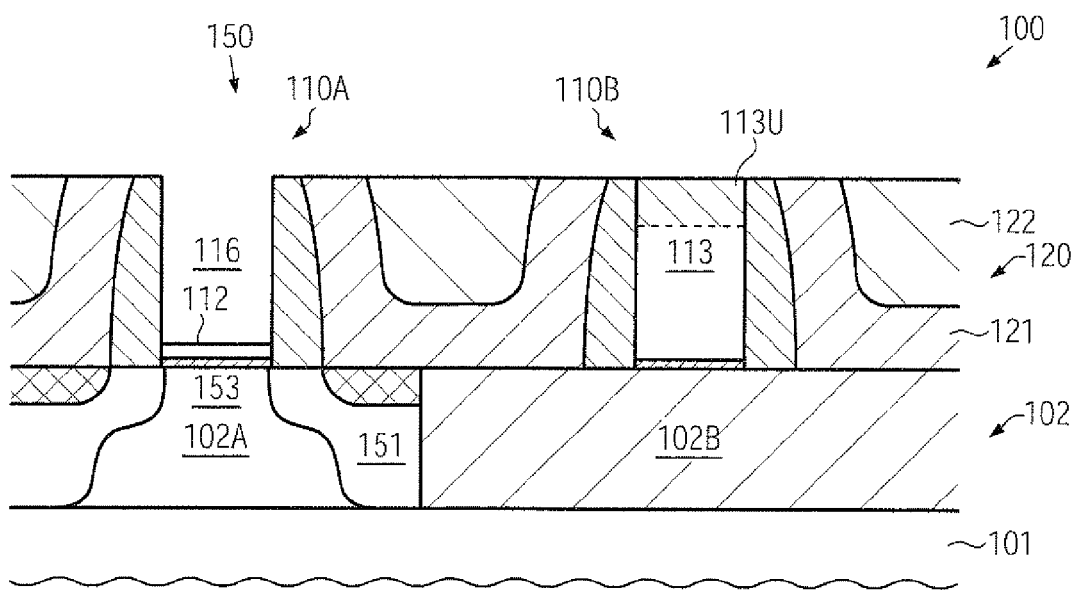

FIG. 1f schematically illustrates the semiconductor device 100 with an opening 116 formed in the gate electrode structure 110A due to the removal of the material 113, while the material 113 may be substantially preserved in the resistive structure 110B. It should be appreciated that the layer 112 may act as an efficient protection layer upon forming the opening 116 during the etch process 105 of FIG. 1e. In other cases, if required, the layer 112 may be removed upon forming the opening 116 and may be replaced by any other appropriate material, such as a high-k dielectric material and the like.

Thereafter, any further material or materials may be filled into the opening 116, such as a work function adjusting species, possibly in combination with other conductive materials, such as titanium nitride, tantalum nitride and the like. It should be appreciated that, typically, P-channel transistors and N-channel transistors may require different types of conductive materials to be filled in the openings 116 in order to obtain a target work function for these different transistor elements. Consequently, depending on the process strategy, materials may be deposited and may be selectively removed, followed by the deposition of a further material, depending on the overall process strategy for providing the different work function materials. Finally, a desired electrode material may be deposited.

Figure 1G:
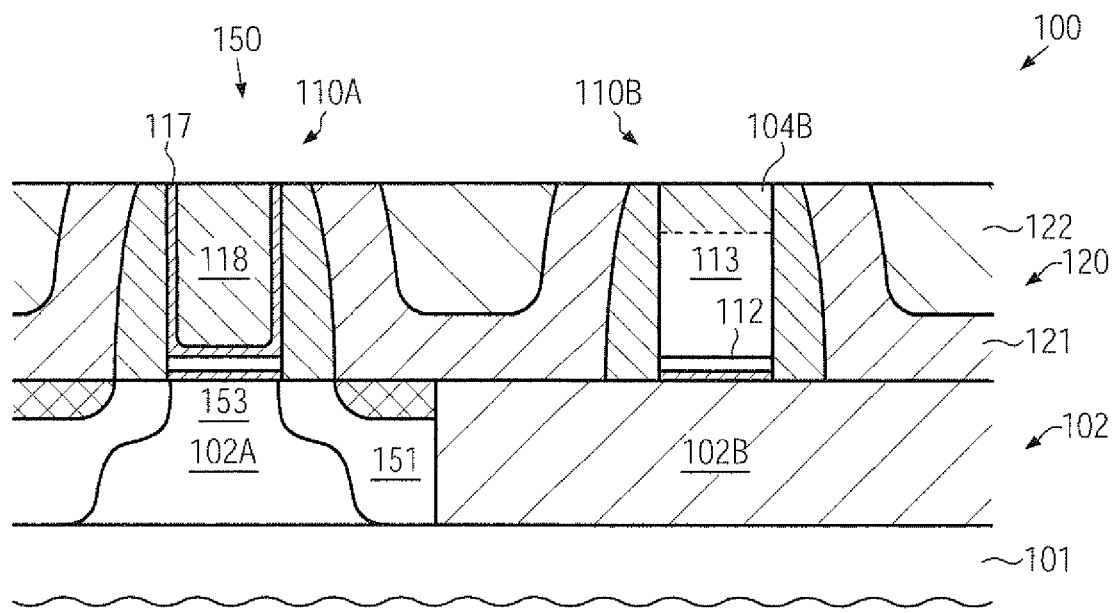

FIG. 1g schematically illustrates the semiconductor device 100 in a further advanced manufacturing stage in which one or more material layers 117 are formed in the gate electrode structure 110A, which may comprise a work function adjusting species, such as lanthanum, aluminum and the like, followed by an electrode material 118, such as aluminum and the like. On the other hand, the resistive structure 110B may comprise the semiconductor material 113 which may determine the overall resistance of the structure 110B, in combination with the geometric configuration and possibly in combination with the layer 112 when comprised of a conductive material. Hence, the semiconductor device 100 may comprise the transistor element 150 having the desired superior electrical performance due to the metal gate electrode structure 110A, while the resistive structure 110B may be provided on the basis of reduced dimensions due to increased resistivity of the semiconductor material 113 compared to the electrode material 118. Consequently, the resistive structure 110B may be provided on the basis of well-established design criteria for semiconductor-based resistors without requiring significant modification, wherein the conductivity of the layer 112 may be readily taken into consideration.

It should be appreciated that the etch resistivity of the material 113 of the resistive structure 110B may be modified at any appropriate manufacturing stage since implantation parameters, such as implantation energy, may be readily adapted to incorporate a desired concentration in the upper portion 113U (FIG. 1f), irrespective of the configuration of the structure 110B.

Figure 1H:
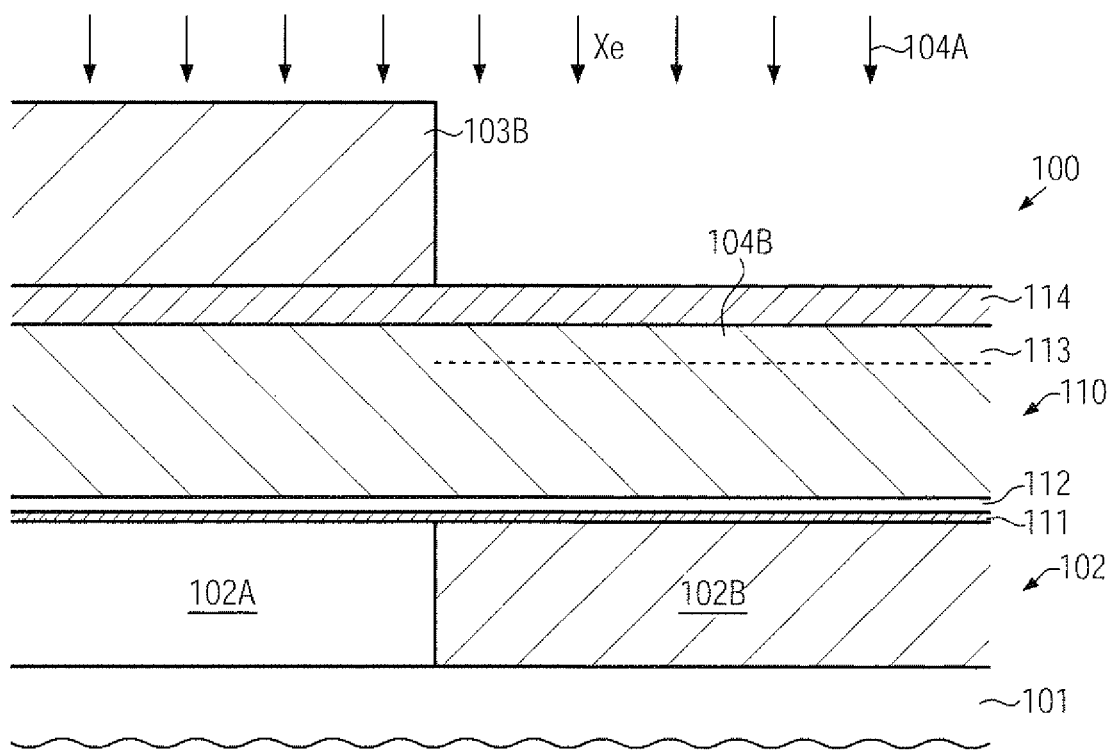
FIGS. 1h-1i schematically illustrate cross-sectional views of the semiconductor device according to still further illustrative embodiments in which the etch resistivity of the semiconductor material may be selectively increased in the resistive structure prior to completing the basic transistor configuration.

FIG. 1h schematically illustrates the semiconductor device 100 according to illustrative embodiments in which the etch resistivity of the material 113 may be selectively increased in an early manufacturing stage, i.e., prior to actually patterning the gate electrode structure 110A and the resistive structure 110B (FIG 1b). As shown, an implantation mask 103B, such as a resist mask, is formed so as to expose a portion of the layer stack 110 formed above the isolation structure 102B. Due to the presence of additional materials of the layer stack 110, such as a cap layer 114, process parameters, i.e., implantation energy of the implantation process 104A, are appropriately adjusted in order to incorporate the species 104B in the semiconductor layer 113. Appropriate process parameters may be readily determined by simulation, experiments and the like. After the implantation process 104A, the mask 103B may be efficiently removed, while the cap layer 114 may preserve integrity of the material 113. Thereafter, the further processing may be continued, as is described above with reference to FIGS. 1a-1b, in order to pattern the gate electrode structure 110A and the resistive structure 110B, which may thus have incorporated therein the implantation species 104B imparting the increased etch resistivity to the material 113 selectively in the resistive structure 110B (FIG. 1g).

Figure 1I:
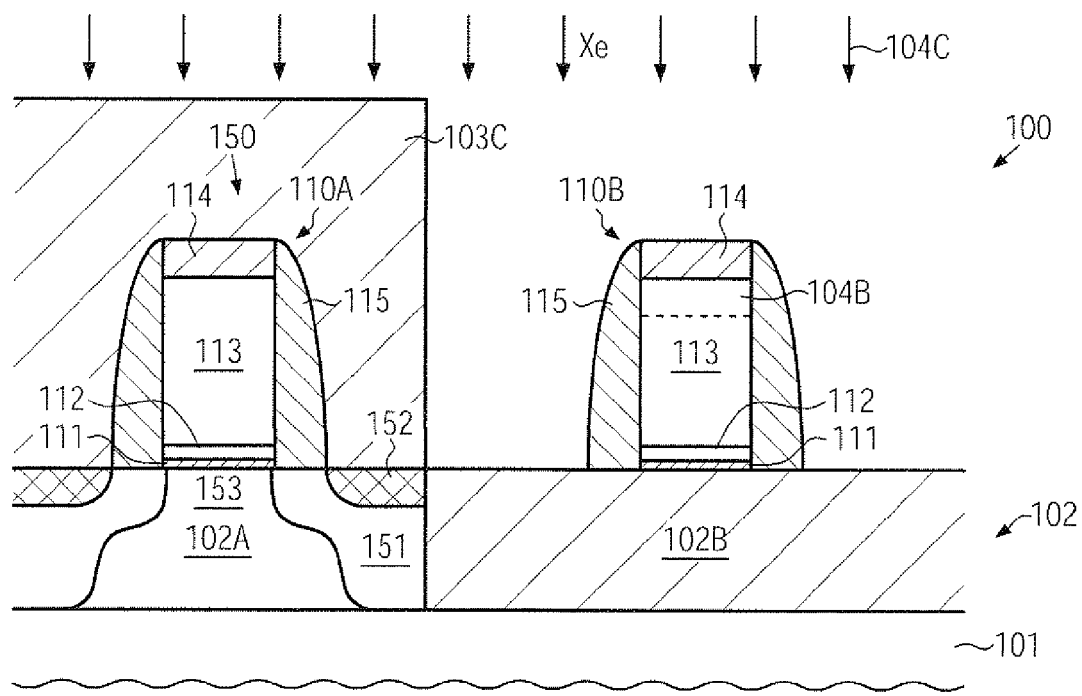

FIG. 1i schematically illustrates the semiconductor device 100 according to a further illustrative embodiment in which an implantation process 104C may be performed in a manufacturing stage in which the gate electrode structure 110A and the resistive structure 110B are already formed. As illustrated, an implantation mask 103C may cover the gate electrode structure 110A and the active region 102A and may expose the structure 110B and the isolation region 102B. Thus, the implantation species 104B may be selectively incorporated into the semiconductor material 113 of the resistor 110B, wherein process parameters may be adapted so as to take into consideration the presence of the cap layer 114, as is also discussed above. After removing the implantation mask 103C, the further processing may be continued, for instance, by forming metal silicide regions and depositing an interlayer dielectric material.

It should be appreciated that the embodiments described with reference to FIGS. 1h and 1i may represent any appropriate manufacturing stage for incorporating the implantation species 104B, thereby providing a high degree of flexibility in scheduling the overall manufacturing process.

Figure 1J:
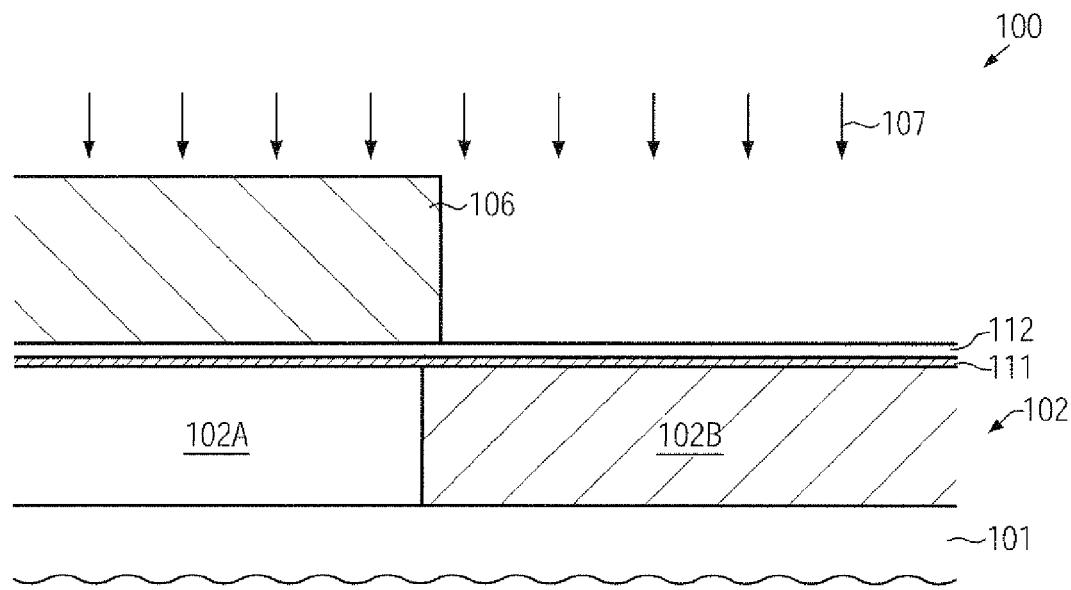
FIGS. 1j-1k schematically illustrate cross-sectional views of the semiconductor device according to still further illustrative embodiments in which a conductive cap material may be removed selectively from above the resistor region so as to further reduce the specific conductivity of a resistive structure.
Figure 1K:
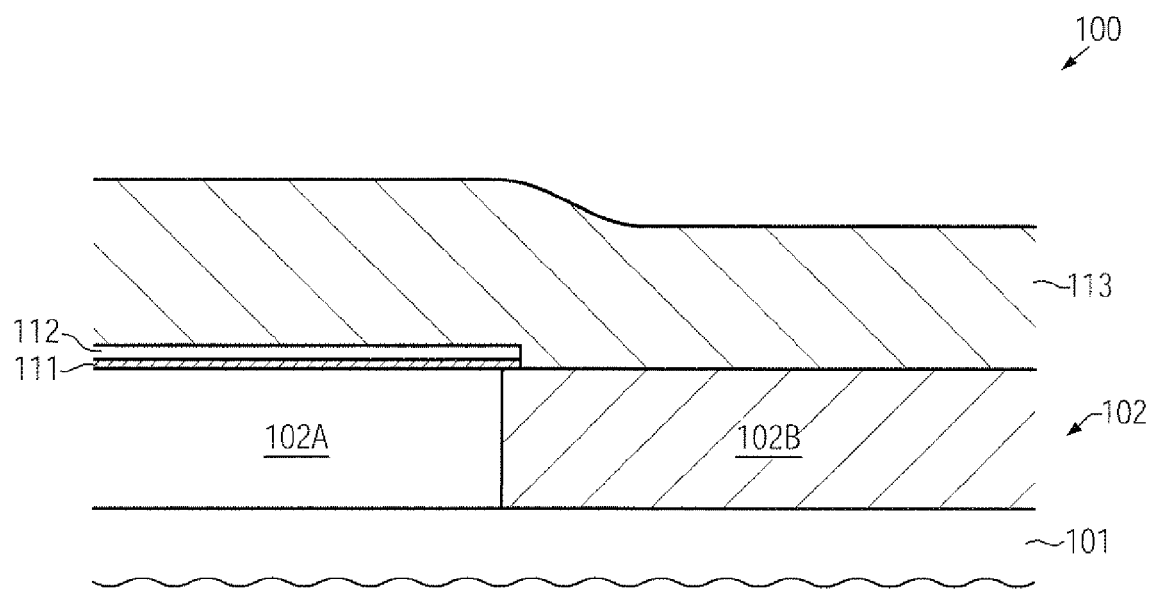

With reference to FIGS. 1j and 1k, illustrative embodiments will now be described in which a conductive cap layer formed above a high-k dielectric material may be removed in an early manufacturing stage in order to reduce the overall conductivity of a resistive structure.

FIG. 1j schematically illustrates the semiconductor device 100 in a manufacturing stage in which the material system 111, which may comprise a high-k dielectric material, may be formed above the regions 102A, 102B, followed by a conductive material, such as the cap layer 112, for instance in the form of titanium nitride and the like. Moreover, an etch mask 106, such as a resist mask and the like, may be provided so as to expose the material 112 above at least a portion of the isolation structure 102B. Furthermore, the device 100 may be exposed to a reactive etch ambient 107, during which at least the material layer 112 may be removed. For instance, a plurality of wet chemical etch recipes, plasma assisted etch processes or a combination thereof may be applied in order to remove the material 112, possibly in combination with the material 111, while using the material of the isolation structure 102B as an efficient etch stop material. Thereafter, the etch mask 106 may be removed and the further processing may be continued by depositing a semiconductor material.

FIG. 1k schematically illustrates the semiconductor device 100 with the semiconductor material 113 formed above the regions 102A, 102B. With respect to any characteristic of the material 113, the same criteria may apply as previously explained. It should be appreciated that, if desired, a planarization process may be performed so as to obtain substantially the same height level above the region 102A and above the isolation structure 102B. In other cases, the planarization may be performed in a later stage, for instance upon providing an additional cap material, such as a silicon nitride material and the like. The planarization may be accomplished by using etch techniques, CMP and the like. Thereafter, the further processing may be continued by forming the gate electrode structure and the resistive structure, as previously explained, wherein a resistance value of the resistive structure may be determined by the geometry and the electrical characteristics of the semiconductor material 113, since any further conductive material, such as the layer 112, has been removed.

As a result, the present disclosure provides semiconductor devices and manufacturing techniques in which the etch resistivity of a semiconductor material, such as a polysilicon material, may be locally increased in a resistive structure by incorporating an appropriate implantation species so that, during a wet chemical etch process, the semiconductor material may be efficiently removed from the replacement gate electrode structure without causing undue material erosion in the resistive structure. Consequently, the resistance value of the resistive structure may be efficiently adjusted by selecting appropriate dimensions and electrical characteristics of the semiconductor material, while, at the same time, a high performance metal gate stack may be provided for transistor elements. The implantation species for increasing the etch resistivity of the semiconductor material in the resistive structure may be incorporated at any appropriate manufacturing stage, thereby obtaining a high degree of flexibility in scheduling the overall manufacturing process flow.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a resistive structure of a semiconductor device, the method comprising:
   forming a layer stack above a transistor region and a resistor region of said semiconductor device, said layer stack comprising a high-k dielectric material and a semiconductor material;
   forming a replacement gate electrode structure in said transistor region;
   increasing an etch resistivity of said semiconductor material selectively in said resistive structure; and
   performing a wet chemical etch process so as to remove said semiconductor material selectively in said replacement gate electrode structure, while substantially maintaining said semiconductor material having the increased etch resistivity in said resistive structure.

2. The method of claim 1, wherein increasing an etch resistivity comprises performing an ion implantation process so as to incorporate an electrically inert species into said semiconductor material selectively in said resistor region.

3. The method of claim 2, wherein said electrically inert species comprises xenon.

4. The method of claim 1, further comprising forming a transistor on the basis of said replacement gate structure, forming a dielectric material above said transistor and said resistive structure and selectively replacing said semiconductor material after forming said dielectric material.

5. The method of claim 4, wherein increasing said etch resistivity is performed after forming said dielectric material.

6. The method of claim 5, further comprising planarizing said dielectric material and exposing said semiconductor material of said replacement gate electrode structure and of said resistive structure and wherein said etch resistivity is increased after planarizing said dielectric material.

7. The method of claim 4, wherein said etch resistivity is increased prior to forming said dielectric material.

8. The method of claim 7, wherein said etch resistivity is increased prior to forming said replacement gate electrode structure.

9. The method of claim 1, wherein forming said material layer stack comprises forming a conductive cap layer above said high-k dielectric material.

10. The method of claim 9, wherein forming said resistive structure comprises removing at least said conductive cap layer from above said resistor region prior to forming said replacement gate electrode structure and said resistive structure.

11. The method of claim 1, wherein forming said layer stack comprises depositing at least one of silicon and germanium as said semiconductor material.

12. A method, comprising:
   forming a replacement gate electrode structure above an active semiconductor region and a resistive structure above an isolation structure, said replacement gate electrode structure and said resistive structure comprising a semiconductor material;
   incorporating an implantation species into said semiconductor material selectively in said resistive structure so as to impart an increased etch resistivity to said semiconductor material;
   removing said semiconductor material selectively from said replacement gate electrode structure while substantially maintaining said semiconductor material having the increased etch resistivity; and
   forming a metal-containing electrode material in said replacement gate electrode structure.

13. The method of claim 12, wherein said implantation species comprises xenon.

14. The method of claim 12, further comprising forming drain and source regions in said active region prior to incor porating said implantation species into said semiconductor material.

15. The method of claim 12, further comprising forming drain and source regions in said active region after incorporating said implantation species into said semiconductor material.

16. The method of claim 15, wherein said implantation species is incorporated into said semiconductor material prior to forming said resistive structure.

* * * * *